United States Patent [19]

Owen, III et al.

[11] 4,026,733
[45] May 31, 1977

[54] PROCESS FOR DEFINING POLYCRYSTALLINE SILICON PATTERNS

[75] Inventors: William H. Owen, III, Sunnyvale; Charles H. R. Steele, Santa Clara; Richard D. Pashley, Mountain View, all of Calif.

[73] Assignee: Intel Corporation, Santa Clara, Calif.

[22] Filed: Oct. 29, 1975

[21] Appl. No.: 626,857

[52] U.S. Cl. .................. 148/1.5; 29/578; 148/187; 156/628; 156/657; 156/662

[51] Int. Cl.² ......................... H01L 21/26

[58] Field of Search ............... 156/3, 7, 8, 17; 148/174, 175, 1.5, 187; 29/578; 357/59

[56] References Cited

UNITED STATES PATENTS

| 3,600,651 | 8/1971 | Duncan | 357/59 |
| 3,801,390 | 4/1974 | Lepselter et al. | 156/8 |
| 3,808,068 | 4/1974 | Johnson et al. | 156/8 |
| 3,892,606 | 7/1975 | Chappelow et al. | 156/7 |
| 3,940,288 | 2/1976 | Takagi et al. | 148/1.5 |
| 3,980,507 | 9/1976 | Carley | 156/17 |

Primary Examiner—Douglas J. Drummond
Assistant Examiner—Jerome W. Massie
Attorney, Agent, or Firm—Blakely, Sokoloff, Taylor & Zafman

[57] ABSTRACT

A process and method for accurately defining polycrystalline silicon patterns from a masking member. The critical dimensions of the silicon patterns are controlled by a diffusion step. Self-limiting etching is achieved through use of an etchant which discriminates between doped and undoped polycrystalline silicon. The process which provides significant advantages in production processing, permits fabrication of narrower gates and smoother edges on elongated silicon strips.

8 Claims, 6 Drawing Figures

PROCESS FOR DEFINING POLYCRYSTALLINE SILICON PATTERNS

BACKGROUND OF THE INVENTION:

1. Field of the Invention

The invention relates to the forming of polycrystalline silicon patterns such as those employed in MOS silicon gate transistors.

2. Prior Art

In the fabrication of integrated circuits, particularly metal-oxide-semiconductor (MOS) circuits employing polycrystalline silicon gates, a silicon layer is etched to form gates or other circuit elements such as interconnecting lines, capacitors, and others. Generally, a masking layer or member (typically an oxide or nitride layer) is defined in a predetermined pattern by photolithographic techniques on a polycrystalline silicon layer. Then, the polycrystalline silicon layer is subjected to a silicon etchant, for example, by dipping the substrate in an etchant or through use of a plasma, to remove the regions of the silicon layer not protected by the masking member. This etching process is not self-limiting, and results in uncontrolled undercutting, which shall be discussed in more detail in conjunction with FIG. 1. Moreover, with this prior art etching process, only a few wafers may be etched at one time, and even then, the etching is not always uniform across a given wafer, or from wafer-to-wafer. In contrast with the present invention, there is a controlled shift in the critical dimensions from the masking member to the final silicon pattern.

Typically, in the fabrication of silicon gates for field-effect transistors, gate widths of 6 ± 1 micron are obtainable. The performance of MOS field-effect transistors may be improved by reducing the width of these gates; this reduction provides a better speed/power product, and also permits fabrication of denser arrays. However, this critical gate width is limited by the accuracy obtainable from the etching process, and other parameters used to define the gate. With the prior art etching process, primarily because of the uncontrolled undercutting, it is difficult to reduce this critical gate width in production processing.

Narrower channel widths in field-effect transistors been obtained through the use of lateral diffusion. For example, an n-type (phosphorous) source region and drain region are typically formed in alignment with a gate. Through lateral diffusion from these regions, the channel width is reduced. However, the advantages gained by this narrower channel, to some extent, are offset by the increase in gate-to-source and gate-to-drain capacitance. This increase capacitance, particularly the Miller capacitance caused by the overlapping of the gate and drain region, reduces the speed of the transistor.

SUMMARY OF THE INVENTION

An etching process is described for forming a polycrystalline silicon member from a polycrystalline silicon layer such as during the fabrication of an integrated circuit. The polycrystalline silicon layer is doped in a predetermined pattern; this doping includes lateral diffusion to define this predetermined pattern. The polycrystalline silicon layer is then subjected to an etchant which discriminates between the doped and undoped portions of this silicon layer. In this manner, the polycrystalline silicon layer is etched to define the desired silicon member.

BRIEF DESCRIPTION OF THE DRAWINGS:

FIG. 2 is a cross-sectional, elevation view of a portion of a substrate which includes an oxide layer, a polycrystalline silicon layer and a masking member;

FIG. 3 illustrates the substrate of FIG. 2 after the substrate has been adjusted to a dopant;

FIG. 4 illustrates the substrate of FIG. 3 after the masking member has been removed;

FIG. 5 illustrates the substrate of FIG. 4 after the doped regions of the polycrystalline silicon layer have been removed by etching.

DETAILED DESCRIPTION OF THE INVENTION:

The present invention discloses a process and method for accurately defining polycrystalline silicon patterns from a polycrystalline silicon layer and masking member. The disclosed process and method which is suitable for high volume production processing, may be used to form the silicon gate of an MOS device, as well as interconnecting lines and regions, capacitors and other integrated circuit elements and members. The invention, however, shall be described in connection with the fabrication of a silicon gate, field-effect transistor, where arsenic is employed as the impurity for the source and drain regions. It will be apparent to one skilled in the art that the process and method, as described, may readily be adapted to fabricating other circuit elements and members.

Before describing the present invention, the undercutting problem associated with fabricating a silicon gate for a field-effect transistor with prior art processes shall be described in more detail. In the fabrication of a silicon gate field-effect transistor, the typical processing steps include the formation of a gate oxide layer on a silicon substrate. (The detail processing steps and formation of other oxide layers such as a field oxide layer, are not described since they are known in the art and not necessary to explain the process of this invention). A polycrystalline silicon layer is then disposed on this gate oxide layer. This polycrystalline silicon layer is subsequently etched to form the gate of the field-effect transistor. In order to define the polycrystalline silicon gate, a masking member is formed on the exposed surface to this silicon layer, through well known lithographic techniques. Following this, the polycrystalline silicon layer is etched with a silicon etchant to remove the regions of the silicon layer not protected by the masking member. The remaining silicon layer then becomes the gate of the field-effect transistor.

Figure 1:
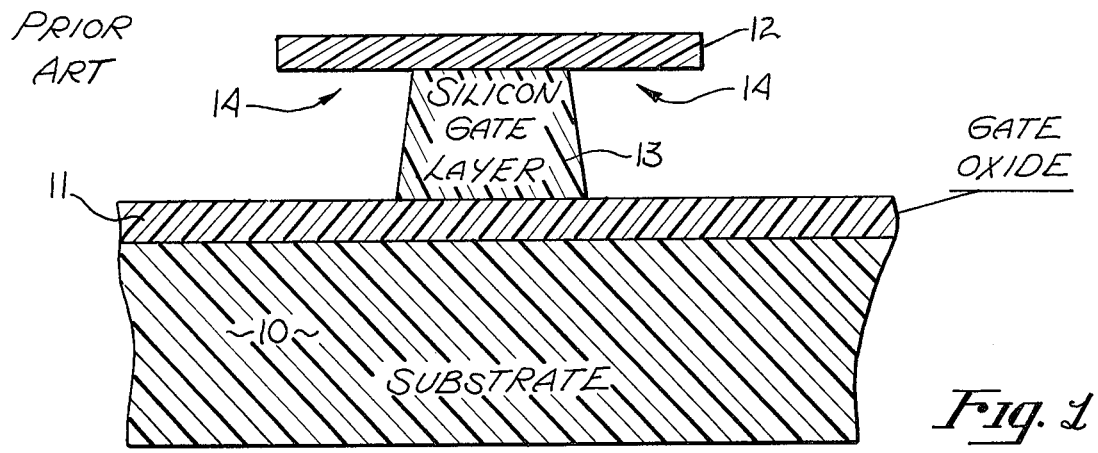
FIG. 1 is a cross-sectional, elevation view of a substrate which includes an etched silicon gate and gate masking member. This figure is used to illustrate the prior art undercutting problem associated with the etching of a polycrystalline silicon gate or other member.

FIG. 1 illustrates a substrate 10 which includes a gate oxide layer 11, a masking member 12, and a silicon gate 13 etched from a silicon layer. As described, after the gate masking member 12 has been formed, the polycrystalline silicon layer is subjected to an etchant, often containing hydrofluoric acid or heated KOH to etch the unmasked regions of the silicon layer, leaving the silicon gate 13. This etching may be performed by placing the entire substrate in the etchant or by subjecting the polycrystalline silicon layer to a plasma. However, such an etching step results in the undercut areas 14. It is difficult to control the extent of this undercutting because of the large number of variables inherent in etching.

As is apparent from FIG. 1 the etchant begins to undercut the gate masking member 12 before sufficient etching has occurred to define the gate. The variations in this undercutting is one of the factors that limits the control of the critical dimensions, such as the gate width in a field-effect transistor. Typically, gates of 6 ± 1 micron may be fabricated in high volume production with this etching process.

Figure 2:
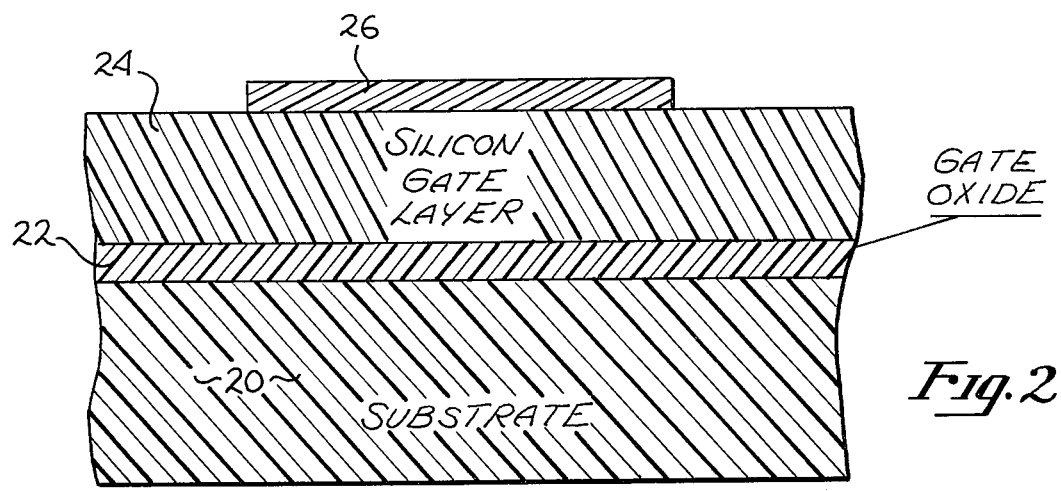
FIGS. 2, 3, 4 and 5 are used to illustrate processing steps for the fabrication of a silicon gate MOS device with the process of the present invention.

Referring to FIG. 2, a silicon substrate 20 is illustrated with a gate oxide 22 grown on the upper surface of the substrate 20. In the presently preferred embodiment the silicon substrate 20 comprises a p-type silicon. A polycrystalline silicon layer 24 is disposed above the gate oxide 22. A masking member 26 may be silicon oxide, silicon nitride or other masking member, is grown or otherwise disposed on the polycrystalline silicon gate layer 24 for defining a silicon gate region in the layer 24. The substrate 20, gate oxide layer 22, polycrystalline silicon layer 24, and masking member 26 are fabricated in the same manner as with the prior art field-effect transistors, and are equivalent to the substrate 10 of FIG. 1 prior to the etching of the silicon gate 13.

Figure 3:
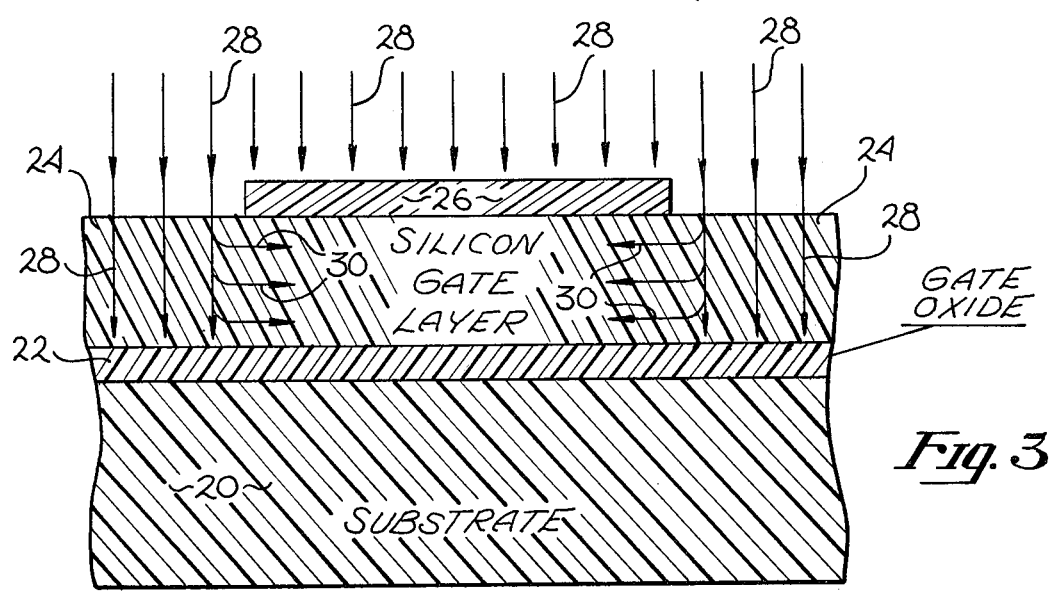

Referring now to FIG. 3, unlike the prior art process which subjects the polycrystalline silicon layer 24 to a silicon etchant, in the presently preferred embodiment, the layer 24 of FIG. 2 is subjected to a phosphorus dopant in a conventional diffusion step. For example, this doping step may be performed in a commercially available predeposition furnace at 950° C for eighteen minutes with a $POCL_3$ gas. This phosphorus doping results in a 4 point probe test [V/I] of three to four ohms. It will be recognized to one skilled in the art that other impurities and carrier gases may be employed as well as other temperatures and times.

The gas and resultant diffusion into the polycrystalline silicon layer 24 is illustrated by lines 28 in FIG. 3. As is apparent in FIG. 3, the masking member 26 prevents doping of the polycrystalline silicon layer directly beneath this member. However, as will explained in more detail, doping occurs beneath the masking member 26 due to the normal lateral diffusion illustrated by lines 30.

Figure 4:
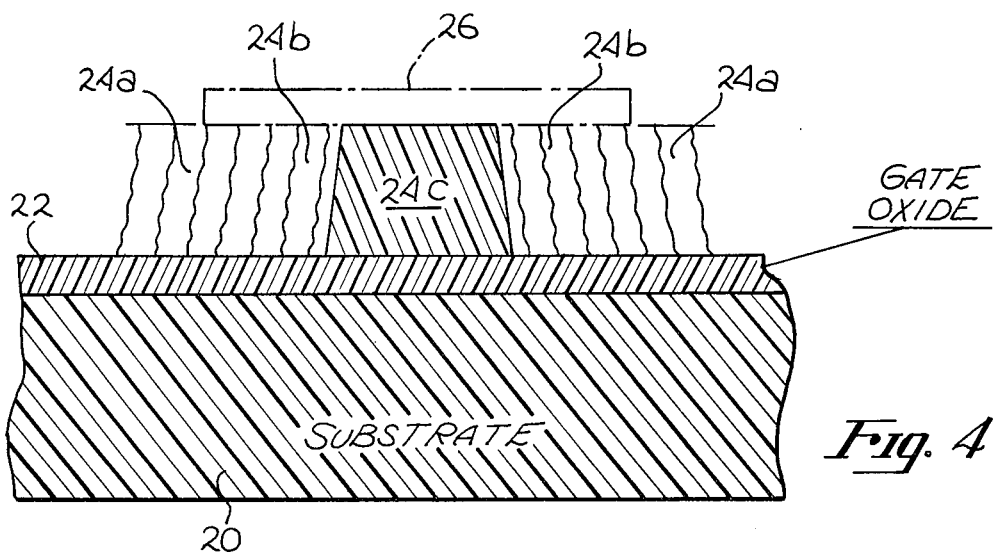

Referring now to FIG. 4, the substrate 20 of FIG. 3 is illustrated after the masking member 26 has been removed. This removal may be accomplished by utilizing known selective etching solutions. In FIG. 4, an outline of the former masking member 26 is illustrated to demonstrate the effects of the doping illustrated in FIG. 3. Those regions of the silicon layer 24 not protected by the masking member 26 during the doping of this layer are illustrated as regions 24a. Those regions of the polycrystalline silicon layer 24 which are doped due to under-diffusion or lateral diffusion, that is, diffusion beneath the masking member 26 are illustrated as regions 24b. Finally, the region of the silicon layer 24 which remains undoped is shown as region or gate 24c. The width of the under-diffused regions 24b may be readily controlled by controlling the lateral diffusion of the dopant. Such under-diffusion or lateral diffusion is easily controlled by known techniques and unlike etching, may be consistently and reliably employed to fabricate region 24c of predetermined width.

Figure 5:
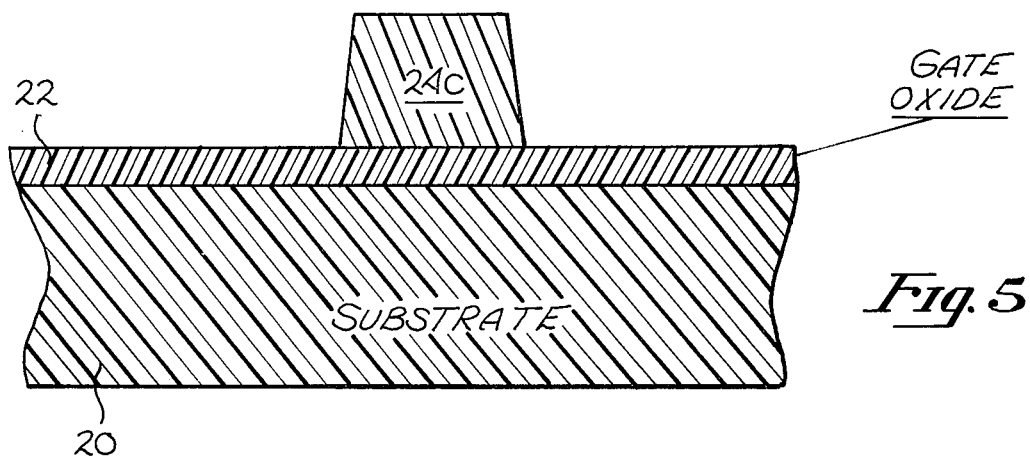

Following the removal of the masking member 26, the polycrystalline silicon layer 24 is subjected to an etching solution which discriminates between the doped and undoped polycrystalline silicon, to remove the regions 24a and 24b. As illustrated in FIG. 5, once the regions 24a and 24b are removed by etching, the remainder of the silicon layer forms gate 24c.

In the presently preferred embodiment, the etchant which discriminated between doped and undoped polycrystalline silicon comprises by volume, 7 mls of hydrofluoric acid, 525 mls of nitric acid and 1800 mls of acetic acid. These concentrated acids may be "electronic grade" or "chemically pure grade" acids. This solution is preferably aged prior to its use. Such aging may be accomplished by first combining the hydrofluoric and nitric acids, and then by adding pieces of silicon (such as scrap pieces) to the hydrofluoric and nitric acids in sufficient quantities to activate or age the solution. Typically, such aging requires approximately ten minutes. The acetic acid is then added in the quantity indicated and the resultant etchant is used to etch the doped polycrystalline silicon. The etchant effectively discriminates between the doped and undoped polycrystalline silicon, leaving the undoped silicon substantially undisturbed. Unlike the prior art etching, this etching is self-limiting since the etchant discriminates between the undoped and doped polycrystalline silicon.

Assume for sake of discussion that the masking member 12 of FIG. 1 and the masking member 26 of FIGS. 2 through 4 may be fabricated to a tolerance of ± 0.5 microns and have a nominal width of 6 microns. As mentioned, with the prior art processes illustrated in FIG. 1, the resultant silicon gate 13 may be fabricated in high volume production to 6 ± 1 micron. However, with the disclosed process, through under-diffusion or lateral diffusion beneath the masking member, the resultant gate 24c may have a width as narrow as 3 ± 0.7 microns. While the present invention does not solve the problems caused by the present masking tolerances of ± 0.5 microns, an approximately 50% improvement in the tolerance relating to etching is achieved. That is, there is a more controlled shift of the critical dimensions from the masking member to the etched polycrystalline silicon member. Thus, in addition to providing a narrower gate, the process of this invention provides narrower tolerances. It will be appreciated that where still narrower gates, strips or other members are required, the amount of lateral diffusion may be increased, for example, by increasing the temperature in the predeposition furnace, or by the use of an oxidation driver step to further laterally diffuse the phosphorus impurity into the polycrystalline silicon before etching. However, oxide etching is required before the polycrystalline silicon etching to remove the oxide formed during such an oxidation driver step.

The improved tolerances gained with the present invention are particularly noticeable in the fabrication of an elongated polycrystalline silicon strip. Typically, when a silicon strip is fabricated with the prior art techniques, such as those described in conjunction with FIG. 1, the resultant strip has ragged and uneven edges. When the present invention is employed relatively smooth, sharp edges are obtained. To fabricate such a strip, lateral diffusion of approximately one micron or more (from each side) of a masking member is employed prior to the etching. This lateral diffusion of the impurity provides a relatively smooth edge (diffusion front) between doped and undoped silicon when compared with the prior art etching step.

Figure 6:
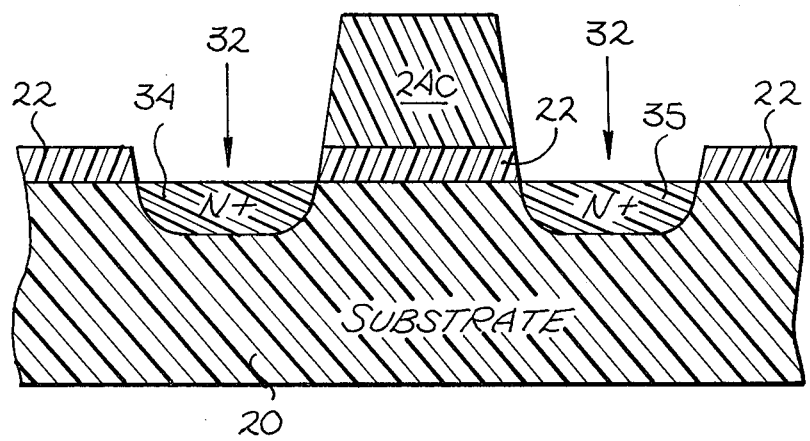
FIG. 6 illustrates the substrate of FIG. 5 after a source and drain region have been formed in the substrate.

Referring to FIG. 6, in the presently preferred embodiment, the substrate 20 of FIG. 5 is processed to form a field-effect transistor by opening spaced-apart windows 32 through the gate oxide layer 22 adjacent to the gate 24c. These windows may be formed by etching with known photolithographic techniques. The n-type source and drain regions 34 and 35 are doped within the p-type substrate 20. In the presently preferred embodiment, these regions are doped with arsenic through ion implantation. The source and drain regions are doped to a level of approximately $5 \times 10^{19}$ atoms/cm$^3$. The arsenic dopant is utilized since it diffuses very slowly. Thus, during subsequent processing of the substrate 20, only minor lateral diffusion occurs, hence there is very little overlapping of the gate, and source and drain regions. This is in contrast to a phosphorus dopant which more readily laterally diffuses. In practice, it has been found that the lateral diffusion from the arsenic source and drain regions for the disclosed process is approximately 0.3 microns. This is substantially less than the 1.3 microns of lateral diffusion which occurs in the prior art devices which have phosphorus source and drain regions.

The disclosed process and method may be utilized in the fabrication of present silicon gate, MOS integrated circuits, particularly those designed for phosphorus source and drain regions. This may be accomplished without altering existing masks and without major process changes. In such cases, instead of forming the gates of the field-effect transistors with the etching process described in conjunction with FIG. 1, the gates are formed by doping the silicon gate layer and then etching the doped portions of that layer as described above. In this manner narrower gates may be fabricated. Moreover, if desired, source and drain regions may be doped with arsenic in order to reduce the Miller capacitance. Tests on a static random-access memory fabricated with the prior art process and this invention have shown that Miller capacitance is reduced by approximately 75% and that access times are reduced by approximately 30%. Thus, the invented process and method provides substantial benefits for existing designs. Even greater benefits may be obtained where the density of an integrated circuit is increased with the disclosed process by taking advantage of the narrower gate widths.

An improved process for making MOS devices has been disclosed. The invention provides better control of critical dimensions in polycrystalline silicon circuit elements and members, such as gates of field-effect transistors. The process and method is readily adaptable with only minor modifications to existing MOS processes without the use of special equipment. The process provides substantial improvements in performance such as improved speed in MOS transistors.

We claim:

1. A process for selectively etching a polycrystalline silicon layer to define a region of said layer comprising the steps of:

forming a masking member on said polycrystalline silicon layer;

diffusing an impurity into said polycrystalline silicon layer in alignment with said masking member and including predetermined lateral diffusion beneath said masking member; removing said masking member;

subjecting said polycrystalline silicon layer to an etchant which selectively removes the doped silicon;

whereby a narrower polycrystalline silicon region may be more controllably etched.

2. A process for selectively etching a polycrystalline silicon layer on a silicon substrate to define the gate region of an MOS field-effect transistor where said gate region has a predetermined width, comprising the steps of:

forming a gate masking member on said polycrystalline silicon layer;

diffusing an impurity into said polycrystalline silicon layer such that the dopant beneath said gate masking member thereby defining said predetermined width of said gate region; removing said masking member;

subjecting said polycrystalline silicon layer to an etchant which selectively removes the doped silicon, whereby a narrower polycrystalline silicon region may be more controllably etched.

3. The process defined by claim 2 wherein said impurity comprises phosphorus.

4. The process defined by claim 2 wherein said etchant comprises hydrofluoric acid, acetic acid and nitric acid.

5. A process for fabricating a field-effect transistor on a silicon substrate which includes a gate oxide layer disposed on said substrate and a polycrystalline silicon gate layer disposed on said gate oxide layer, comprising the steps of:

forming a gate masking member on said polycrystalline silicon layer;

diffusing an impurity into said polycrystalline silicon gate layer such that unmasked silicon is doped with said impurity, and such that said impurity extends beneath said gate masking member to define an undoped region of a predetermined width; removing said masking member;

subjecting said polycrystalline silicon layer to an etchant which removes doped polycrystalline silicon, thereby defining a polycrystalline silicon gate;

forming a pair of spaced-apart openings through said gate oxide layer, adjacent to said gate; and, doping regions of said substrate through said openings to form the source and drain regions of said transistor;

whereby a field-effect transistor may be fabricated where the width of said silicon gate is determined in part by said diffusion step.

6. The process defined by claim 5 wherein said source and drain regions are doped with arsenic.

7. The process defined by claim 5 wherein said source and drain regions are doped with arsenic through ion implantation.

8. The process defined by claim 5 wherein said impurity diffused into said polycrystalline silicon layer comprises phosphorus.

* * * * *

UNITED STATES PATENT OFFICE
CERTIFICATE OF CORRECTION

Patent No. 4,026,733    Dated May 31, 1977

Inventor(s) William H. Owen, III, et al.

It is certified that error appears in the above-identified patent and that said Letters Patent are hereby corrected as shown below:

Column 1, Line 47:  at the beginning of the line, insert --have--.

Column 3, Line 24:  between "26 and "may" insert --which--.

Column 3, Line 51:  between "will" and "explained" insert --be--.

Column 4, Line 14:  change "discriminated" to --discriminates--.

Column 4, Line 15:  change "7 mls" to --75 mls--.

Column 6, Line 21:  between "dopant" and "beneath" insert --extends--.

Signed and Sealed this

Thirteenth Day of September 1977

[SEAL]

Attest:

RUTH C. MASON  
Attesting Officer

LUTRELLE F. PARKER  
Acting Commissioner of Patents and Trademarks